United States Patent [19]

Giebel

[11] Patent Number: 4,742,253
[45] Date of Patent: May 3, 1988

[54] INTEGRATED INSULATED-GATE FIELD-EFFECT TRANSISTOR CIRCUIT FOR EVALUATING THE VOLTAGE OF A NODE TO BE SAMPLED AGAINST A FIXED REFERENCE VOLTAGE

[75] Inventor: Burkhard Giebel, Denzlingen, Fed. Rep. of Germany

[73] Assignee: ITT Industries, Inc., New York, N.Y.

[21] Appl. No.: 460,957

[22] Filed: Jan. 25, 1983

[30] Foreign Application Priority Data

Jan. 30, 1982 [EP] European Pat. Off. ......... 82100657.4

[51] Int. Cl.$^4$ .................................. H03K 17/687
[52] U.S. Cl. .................... 307/530; 307/363; 307/584
[58] Field of Search ............... 307/449, 450, 501, 350, 307/530, 550, 352–354, 360, 571, 577, 584, 363

[56] References Cited

U.S. PATENT DOCUMENTS

| | | | |
|---|---|---|---|
| 4,308,468 | 12/1981 | Olson | 307/353 |
| 4,375,600 | 3/1983 | Wu | 307/530 |
| 4,388,541 | 6/1983 | Giebel | 307/530 |
| 4,443,718 | 4/1984 | Hagiwara et al. | 307/530 |
| 4,459,497 | 7/1984 | Kuo et al. | 307/530 |

Primary Examiner—Stanley D. Miller
Assistant Examiner—D. R. Hudspeth
Attorney, Agent, or Firm—T. L. Peterson

[57] ABSTRACT

The circuit merely comprises three transistors, namely one transfer transistor (t) arranged between the input (e) and the output (a), a load transistor (l) connected as a resistor, and a clamping transistor (k), with both of the latter connecting the output (a) to the source of operating voltage (U). The interconnected gates of both the clamping and the transfer transistor (k, t) are connected to a source of reference voltage (Ur). If these two transistors (k, t) are of the depletion type, the two gates thereof may be connected to the zero point of the circuit. The circuit is particularly quick and simple.

8 Claims, 1 Drawing Sheet

INTEGRATED INSULATED-GATE FIELD-EFFECT TRANSISTOR CIRCUIT FOR EVALUATING THE VOLTAGE OF A NODE TO BE SAMPLED AGAINST A FIXED REFERENCE VOLTAGE

The invention relates to an integrated insulated-gate field-effect transistor circuit for evaluating the voltage of a node to be sampled, with the controlled current path of a transfer transistor being arranged between the input and the output, and with the output beng connected to the source of operating voltage via a transistor connected as a load transistor and via the controlled current path of a clamping transistor whose gate is connected to that of the transfer transistor.

Such an integrated MOS circuit, is known from the German Offenlegungsschrift DE No. 29 32 605 A1 in connection with the circuit diagram of the storage module 2716 as referred to therein. FIG. 1 of this German Offenlegungsschrift shows the total circuit of such a MOS circuit which, apart from the transfer transistor (M6) still contains two inverters connected to the input, with the second one controlling the gate of the transfer transistor, and with the first one controlling the gate of a clamping transistor (M3) connected to the input.

The conventional arrangement includes eight MOS transistors and, therefore, is rather expensive. The inventor of the present invention, therefore, has proposed in FIG. 2 of the aforementioned Offenlegungsschrift, a more simplified arrangement which only still contains five transistors. This, however, was still found to be unsatisfactory, so that the inventor has continued to work on the further reduction of the number of components and has arrived at the invention as characterized in the appended claims, which solves the problem of arriving at an arrangement employing only three MOS transistors.

Thus, within the scope of the intended impractical application, the invention represents a maximum of circuit simplicity as well as of insensitivity with respect to the parameter differences between the individual transistors of the circuit.

The invention will now be explained in greater detail with reference to FIGS. 1 and 2 of the accompanying drawings, in which.

Figure 1:
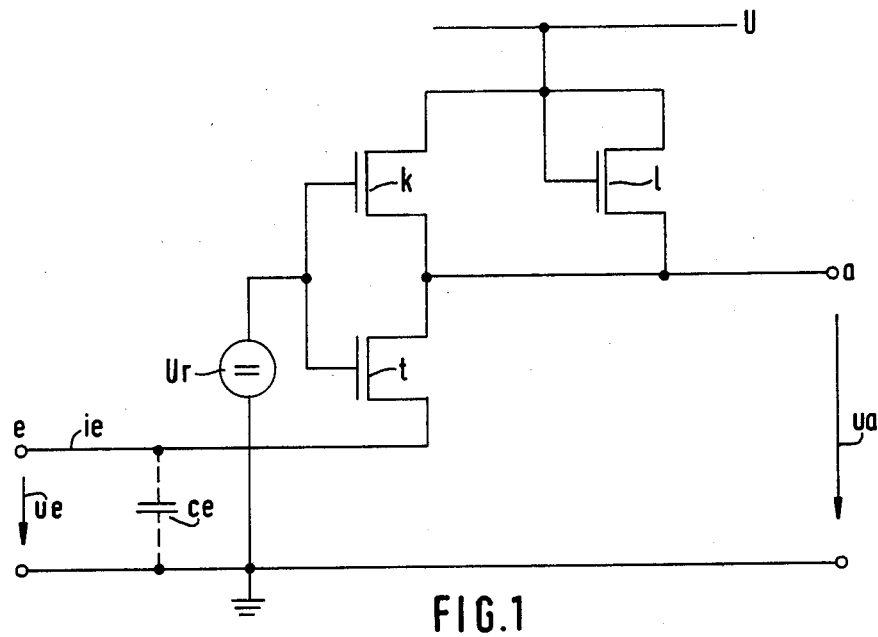
FIG. 1 shows the circuit diagram of a general example of embodiment.

In the general example of embodiment as shown in FIG. 1, the controlled current path of the transfer transistor t is arranged between the input e and the output a, as is also the case with the prior art circuit. The gate of this transfer transistor t, however, unlike in the prior art circuit, is not applied to the output of an inverter, but, in accordance with the invention, to the source of reference voltage Ur.

The output a is connected to the source of operating voltage U via the load transistor L connected as a resistor, and via the controlled current path of the clamping transistor k.

In FIG. 1, the load transistor L is connected as a resistor in that its gate is connected to the source of operating voltage U, i.e., it is presupposed that the load transistor L is of the enhancement type. Again in distinction to the prior art, according to which the gate of the clamping transistor k is connected to the output of the aforementioned inverter, the gate of the clamping transistor according to the invention is likewise connected to the source of reference voltage Ur, i.e., the gates of both the transfer transistor t and the clamping transistor k are connected with one another as in the prior art circuit, but to another point of the circuit, i.e., to the source of reference voltage Ur.

Figure 2:
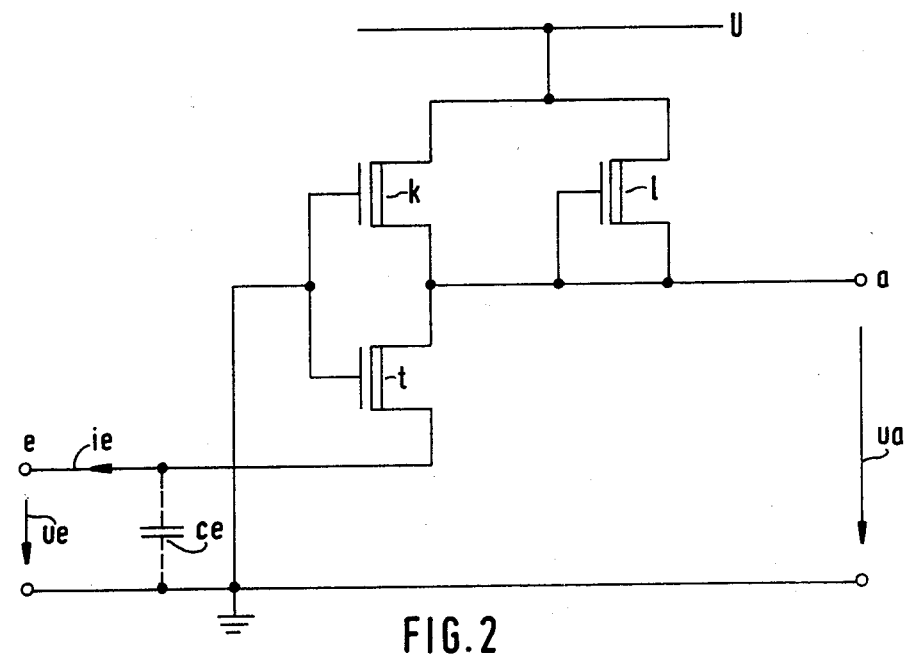
FIG. 2 shows the circuit diagram of a more specific example of embodiment.

In the specific example of embodiment as shown in FIG. 2, the three transistors as such are supposed to be of the depletion type, so that the gate of the load transistor L is connected to the output a. The gates of both the transfer and the clamping transistor which are connected to one another, however, are connected to the zero point of the circuit.

The circuit according to the invention chiefly has two operating ranges:

1. The input voltage ue is so low that the following applies: $Ur - ue > ut$, ($ut$ = gate threshold voltage of the transfer transistor t). By neglecting the load transistor L representing a high-ohmic resistor, both the transfer transistor t and the clamping transistor k may be considered as one single transistor producing a high input current, so that at a low input voltage use, the circuit also has a low input resistance. Accordingly, the output voltage ua is almost equal to the input voltage ue.

2. The input voltage ue is so high that the following relationship applies: $Ur - ue < ut$. In that case both the transfer transistor t and the clamping transistor k are currentless and the high-ohmic resistance of the load transistor L causes a high output voltage ua.

The transition from the one to the other of the two states mentioned hereinbefore, is now of importance. If $Ur - ue$ is only slightly greater than ut then the transfer transistor t is in the saturated state (ua > ue), and, since the clamping transistor k is rendered nonconductive, also the output voltage ua, via the currentvoltage characteristic of the load transistor L, is only a function of the input current ie. Accordingly, the circuit is capable, in the aforementioned state 1, to charge great parasitic capacitances ce rapidly at a node to be sampled, and of reliably recognizing small currents at the transition from state 1 to state 2, which flow in a node to be sampled at an almost constant sampling node potential.

In the preferred practical application of the circuit according to the invention as a sense amplifier in static semiconductor memories, such as read-only memories, such parasitic capacitances ce appear as those of the bit lines connected to the node to be sampled. The voltage of the source of reference voltage Ur may be either constant or variable as a function of time, and for several sense amplifiers of an integrated circuit it is possible to provide one common source of reference voltage. This reference voltage may be produced in a variety of ways, for example, with the aid of a voltage divider, or may be identical with the operating voltage. In particular, it may be equal to the voltage of the zero point of the circuit when both the transistor t and the clamping transistor k are transistors of the depletion type, as is shown in FIG. 2.

I claim:

1. Integrated insulated-gate field-effect transistor circuit for evaluating the voltage of a node to be sampled, said circuit including an input and an output and being connectible to a source of operating voltage, said circuit comprising a tansfer transistor connected between said input and said output and forming a drain source current path therebetweeen, said transfer transistor having a gate, a load transistor connected between said output and said source of operating voltage, and a clamping transistor having a gate connected to said transfer transistor gate and having a source and drain connected between said output and said source of operating voltage, said interconnected transfer transistor and clamping transistor gates being directly connected to a source of fixed reference voltage.

2. A circuit as claimed in claim 1, wherein said circuit is used as a sense amplifier in a static semiconductor memory of the type having a plurality of memory cells, and wherein said input is connected to one of said cells.

3. A circuit as claimed in claim 1, wherein said load transistor is of the depletion type.

4. A circuit as claimed in claim 1, wherein said circuit has a ground reference point, wherein said transfer transistor and said clamping transistor are of the depletion type, and wherein the gates thereof are connected to said ground reference point of said circuit.

5. A circuit as claimed in claim 2, wherein said load transistor is of the depletion type.

6. A circuit as claimed in claim 2, wherein said circuit has a ground reference point, wherein said transfer transistor and said clamping transistor are of the depletion type and wherein the gates thereof are connected to said ground reference point of said circuit.

7. A circuit as claimed in claim 3, wherein said circuit has a ground reference point, wherein said transfer transistor and said clamping transistor are of the depletion type, and wherein the gates thereof are connected to said ground reference point of said circuit.

8. A circuit as claimed in claim 5, wherein said circuit has a ground reference point, wherein said transfer transistor and said clamping transistor are of the depletion type, and wherein the gates thereof are connected to said ground reference point of said circuit.

* * * * *